(12) United States Patent  
Iwata et al.

(10) Patent No.: US 12,426,409 B2  
(45) Date of Patent: Sep. 23, 2025

(54) POINT SOURCE TYPE LIGHT-EMITTING DIODE AND MANUFACTURING METHOD THEREOF

(71) Applicant: DOWA Electronics Materials Co., Ltd., Tokyo (JP)

(72) Inventors: Masatoshi Iwata, Akita (JP); Shinya Shoji, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 458 days.

(21) Appl. No.: 17/593,769

(22) PCT Filed: Mar. 23, 2020

(86) PCT No.: PCT/JP2020/012734  
§ 371 (c)(1),  
(2) Date: Sep. 24, 2021

(87) PCT Pub. No.: WO2020/196411  
PCT Pub. Date: Oct. 1, 2020

(65) Prior Publication Data  
US 2022/0190199 A1  Jun. 16, 2022

(30) Foreign Application Priority Data

Mar. 26, 2019 (JP) .................................. 2019-059295  
Mar. 19, 2020 (JP) .................................. 2020-048945

(51) Int. Cl.  
*H10H 20/816* (2025.01)  
*H10H 20/01* (2025.01)  
(Continued)

(52) U.S. Cl.  
CPC ...... *H10H 20/8162* (2025.01); *H10H 20/013* (2025.01); *H10H 20/824* (2025.01); *H10H 20/835* (2025.01); *H10H 20/032* (2025.01)

(58) Field of Classification Search  
CPC ... H01L 33/145; H01L 33/0062; H01L 33/30; H01L 33/405  
See application file for complete search history.

(56) References Cited

U.S. PATENT DOCUMENTS 8,723,213 B2 * 5/2014 Bae .................... H10H 20/8314  
257/E33.068  
2009/0267096 A1 * 10/2009 Kim ..................... H10H 20/018  
257/98

(Continued)

FOREIGN PATENT DOCUMENTS

JP  2007221029 A  8/2007  
JP  2012129357 A  7/2012

(Continued)

OTHER PUBLICATIONS

Jul. 12, 2022, Office Action issued by the Taiwan Intellectual Property Office in the corresponding Taiwanese Patent Application No. 109110074.

(Continued)

*Primary Examiner* — Jay C Kim  
*Assistant Examiner* — Woo K Lee  
(74) *Attorney, Agent, or Firm* — KENJA IP LAW PC

(57) ABSTRACT

The present disclosure provides a point source type light-emitting diode and a manufacturing method thereof, which simplify a manufacturing process and have superior temperature-dependent characteristic. A point source type light-emitting diode includes a support substrate, a metal layer having a light reflecting surface, a current narrowing layer, a III-V compound semiconductor laminate sequentially having a p-type semiconductor layer, an active layer, and an n-type semiconductor layer, and a top electrode. The top electrode has an opening for ejecting light emitted by the active layer. The current narrowing layer includes a dielectric layer having a through hole and an intermediate elec- (Continued)

trode. In a projection plane in which the current narrowing layer including the intermediate electrode is projected vertically onto the top electrode, the opening encloses the intermediate electrode, and the dielectric layer encloses the top electrode. The thickness of the p-type semiconductor layer is between 0.5 μm and 3.0 μm inclusive.

7 Claims, 6 Drawing Sheets

(51) Int. Cl.
*H10H 20/824* (2025.01)
*H10H 20/832* (2025.01)

(56) References Cited

U.S. PATENT DOCUMENTS

2014/0291612 A1* 10/2014 Aihara .................. H10H 20/84
                                                            438/27
2015/0243862 A1    8/2015 Sheng et al.

FOREIGN PATENT DOCUMENTS

| JP | 2013128072 A | 6/2013 |
|---|---|---|
| JP | 2015170717 A | 9/2015 |
| JP | 2015228497 A | 12/2015 |
| JP | 2018032820 A | 3/2018 |
| KR | 1020120129449 A | 11/2012 |
| TW | I497758 B | 8/2015 |
| WO | 2016157850 A1 | 10/2016 |

OTHER PUBLICATIONS

Dec. 8, 2020, Notification of Reasons for Refusal issued by the Japan Patent Office in the corresponding Japanese Patent Application No. 2020-048945.

Jan. 7, 2021, Office Action issued by the Taiwan Intellectual Property Office in the corresponding Taiwanese Patent Application No. 109110074.

Jun. 4, 2021, Office Action issued by the Taiwan Intellectual Property Office in the corresponding Taiwanese Patent Application No. 109110074.

Jun. 9, 2020, International Search Report issued in the International Patent Application No. PCT/JP2020/012734.

Jun. 9, 2020, Notification of Reasons for Refusal issued by the Japan Patent Office in the corresponding Japanese Patent Application No. 2020-048945.

Sep. 28, 2021, International Preliminary Report on Patentability issued in the International Patent Application No. PCT/JP2020/012734.

* cited by examiner

POINT SOURCE TYPE LIGHT-EMITTING DIODE AND MANUFACTURING METHOD THEREOF

TECHNICAL FIELD

The present disclosure relates to a point source type light-emitting diode and a manufacturing method thereof.

BACKGROUND

In recent years, light-emitting diodes (LEDs) have been used in various applications such as sensors, gas analysis, vehicle-mounted cameras, lighting, signals, sterilization, and resin curing, depending on emission wavelengths. Among these, in the case of using light-emitting diodes for applications of sensor light sources, point source type light-emitting diodes that emit light with uniform intensity distribution are used. In general light-emitting diodes, light is emitted in all directions from a light-emitting region, but point source type light-emitting diodes only emit light in a specific direction. Such a point source type light-emitting diode is disclosed in Patent Literature (PTL) 1, for example.

The point source type light-emitting diode disclosed in PTL 1 includes, sequentially on a support substrate, a metal layer, a first conductive layer, an active layer, a second conductive layer having a current narrowing structure, and a top electrode with an opening for emitting light generated in the active layer. In the point source type light-emitting diode of PTL 1, in order to limit a current-carrying region in the active layer to a part of its plane, the current narrowing structure is formed by providing a current blocking region in the second conductive layer.

CITATION LIST

Patent Literature

PTL 1: JP 2015-170717 A

SUMMARY

Technical Problem

In the above PTL 1, a current narrowing structure is provided by forming a current blocking region consisting of a non-conductive region with a high resistance value in a second conductive layer above an active layer using an ion implantation method. Therefore, the technology of PTL 1 not only increases the number of steps in a manufacturing process, but also requires formation of complex patterns in combination, which may reduce the yield rate. In addition, for practical use, emission output is required to be less susceptible to variations in temperature in an operating environment, and improvement in a temperature-dependent characteristic is required.

Therefore, the present disclosure aims to provide a point source type light-emitting diode and a manufacturing method thereof, which can simplify a manufacturing process and improve the temperature-dependent characteristic of emission output.

Solution to Problem

The inventors have studied diligently to solve the above problem. The inventors tried to control a current diffusion by focusing on the thickness of a p-type semiconductor layer while optimizing the arrangement of a current narrowing layer and a top electrode. As a result, the inventors experimentally confirmed that a main light-emitting region in an active layer can be controlled without requiring a complicated manufacturing process, and that a point source type light-emitting diode can be manufactured with a simple manufacturing process. The present disclosure was completed based on the above findings, and its abstract structure is as follows.

(1) A point source type light-emitting diode including:
  a support substrate;
  a metal layer on the support substrate, the metal layer having a light reflecting surface;
  a current narrowing layer on the metal layer;
  a III-V compound semiconductor laminate on the current narrowing layer, the III-V compound semiconductor laminate sequentially including a p-type semiconductor layer, an active layer, and an n-type semiconductor layer; and
  a top electrode on the III-V compound semiconductor laminate, wherein
  the top electrode has an opening for ejecting light emitted by the active layer,
  the current narrowing layer includes a dielectric layer having a through hole and an intermediate electrode provided in the through hole, and the intermediate electrode electrically connects between the p-type semiconductor layer and the metal layer,
  in a projection plane in which the current narrowing layer including the intermediate electrode is projected vertically onto the top electrode, the opening encloses the intermediate electrode, and the dielectric layer encloses the top electrode, and
  the thickness of the p-type semiconductor layer is 0.5 μm or more and 3.3 μm or less.

(2) The point source type light-emitting diode according to (1) described above, wherein the opening and the intermediate electrode are disposed in such positions that the centers of gravity of the opening and the intermediate electrode coincide in the projection plane.

(3) The point source type light-emitting diode according to (1) or (2) described above, wherein the shortest separation distance between a peripheral edge of the active layer and an outermost periphery of a main light-emitting region in the active layer is 30 μm or more.

(4) The point source type light-emitting diode according to (3) described above, wherein the shortest separation distance is 60 μm or more.

(5) The point source type light-emitting diode according to any one of (1) to (4) described above, wherein the light reflecting surface covers at least a part of a side surface of the active layer via the dielectric layer.

(6) A manufacturing method of a point source type light-emitting diode including:
  a first step for forming a semiconductor laminate including an n-type semiconductor layer, an active layer, and a p-type semiconductor layer sequentially on a growth substrate;
  a second step for forming a current narrowing layer on the p-type semiconductor layer;
  a third step for forming a metal reflective layer on the current narrowing layer;
  a fourth step for forming a metal layer, while a support substrate has a metal bonding layer on its surface is bonded to the metal reflective layer via the metal bonding layer;

a fifth step for removing the growth substrate; and a sixth step for forming a top electrode on a growth substrate removed surface of the n-type semiconductor layer, the top electrode having an opening for ejecting light emitted by the active layer, wherein in the third step, the current narrowing layer including a dielectric layer having a through hole and an intermediate electrode provided in the through hole to electrically connect between the p-type semiconductor layer and the metal layer is formed, in a projection plane in which the current narrowing layer including the intermediate electrode is projected vertically onto the top electrode, the opening encloses the intermediate electrode, and the dielectric layer encloses the top electrode, and the thickness of the p-type semiconductor layer is 0.5 μm or more and 3.3 μm or less.

Advantageous Effect

According to the present disclosure, it is possible to provide a point source type light-emitting diode and a manufacturing method thereof, which can simplify a manufacturing process and improve the temperature-dependent characteristic of emission output.

DETAILED DESCRIPTION

Figure 1:
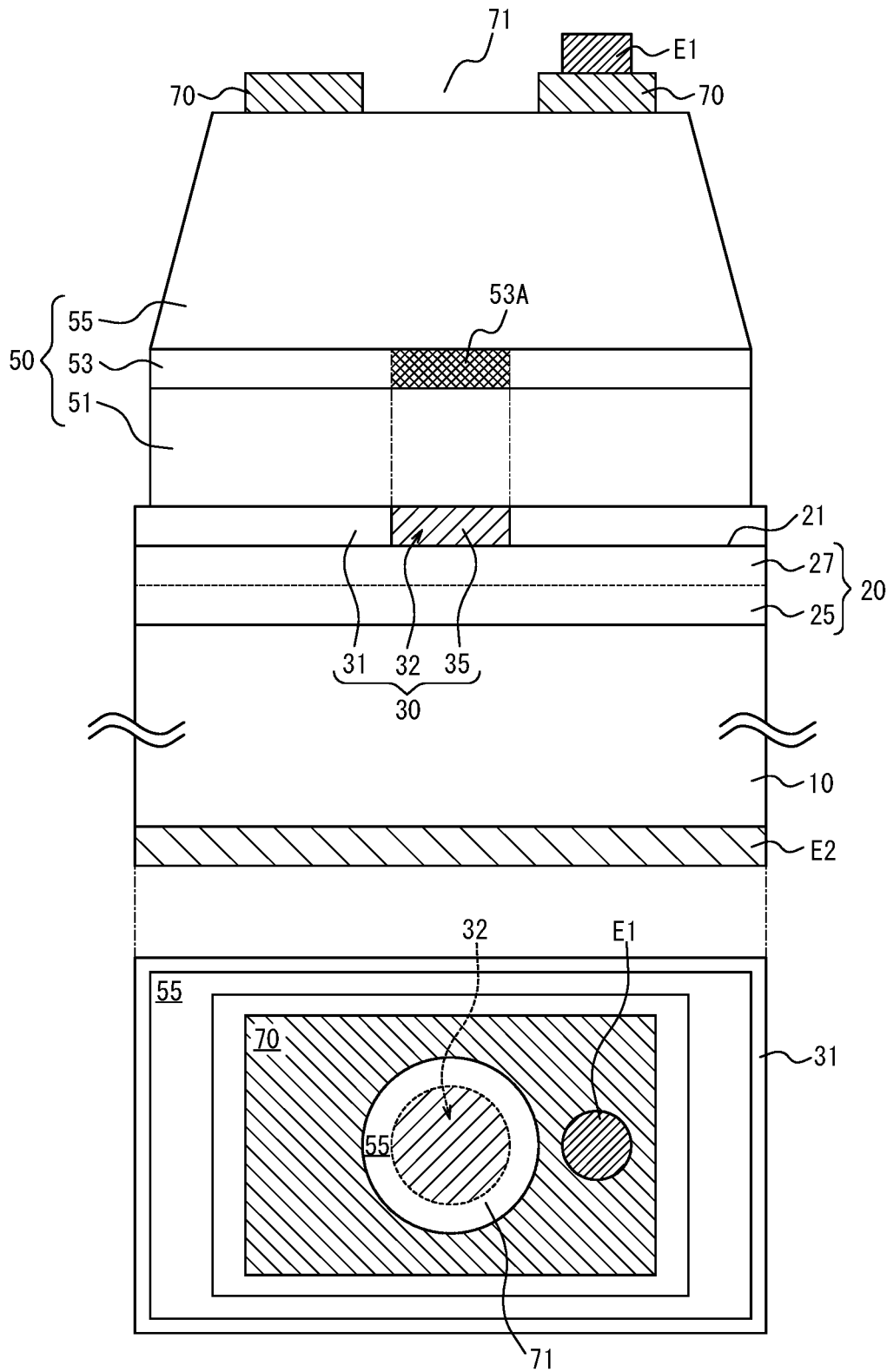
FIG. 1 is a schematic cross-sectional view and top view illustrating an aspect of a point source type light-emitting diode according to the present disclosure.

Before describing an embodiment according to the present disclosure, definitions in this application will be explained.

Various Definitions

<III-V Compound Semiconductor>

First, in a case in which the term "III-V compound semiconductor" is simply used in this application, its composition is expressed by the general formula: $(In_aGa_bAl_c)(P_xAs_ySb_z)$. Here, the following relationship holds for the composition ratio of each element.

For group III elements, $c=1-a-b$, $0 \leq a \leq 1$, $0 \leq b \leq 1$, $0 \leq c \leq 1$ For group V elements, $z=1-x-y$, $0 \leq x \leq 1$, $0 \leq y \leq 1$, $0 \leq z \leq 1$ <P-Type, N-Type, and I-Type, and Dopant Concentration>

In this specification, a layer that electrically functions as a p-type is referred to as a p-type semiconductor layer (sometimes abbreviated as "p-type layer"), and a layer that electrically functions as an n-type is referred to as an n-type semiconductor layer (sometimes abbreviated as "n-type layer"). On the other hand, in the case of intentionally adding no specific impurities such as Si, Zn, S, Sn, or Mg and not electrically functioning as a p-type or a n-type, a layer is referred to as an "i-type" or "undoped". In an undoped III-V compound semiconductor layer, impurities are inevitably mixed in a manufacturing process. Specifically, in a case in which a dopant concentration is low (e.g., less than $7.6 \times 10^{15}$ atoms/cm³), it shall be treated in this specification as being "undoped". The value of an impurity concentration such as Si, Zn, S, Sn, or Mg shall be based on SIMS analysis. Since the value of the dopant concentration significantly varies near the boundary of each semiconductor layer, the value of the dopant concentration at the center of each layer in a film thickness direction shall be used as the value of the dopant concentration.

<Thickness and Composition of Each Layer>

The overall thickness of layers to be formed can be measured using an optical interference film thickness meter. Furthermore, the thickness of each layer can be calculated by observation of a cross section of a growing layer using an optical interference film thickness meter and a transmission electron microscope. If the thickness of each layer is small, about a few nm, to the extent that it is analogous to a superlattice structure, the thickness can be measured using TEM-EDS. In a cross-sectional view of each layer, if a certain layer has an inclined surface, a maximum height from a flat surface of a layer directly underneath the layer is used as the thickness of the layer.

A point source type light-emitting diode and a manufacturing method thereof according to the present disclosure will be described in turn below with reference to the drawings. In principle, the same reference numbers are attached to the same components, and duplicate explanations are omitted. In each figure, the ratio of length and width of a substrate and each layer is exaggerated from the actual ratio for convenience of explanation.

(Point Source Type Light-Emitting Diode)

FIG. 1 illustrates a schematic cross-sectional view and a top view of a point source type light-emitting diode 100 according to an aspect of the present disclosure. The point source type light-emitting diode 100 includes at least a support substrate 10, a metal layer 20 that is on the support substrate 10 and has a light reflecting surface 21, a current narrowing layer 30 on the metal layer 20, a III-V compound semiconductor laminate 50 that is on the current narrowing layer 30 and sequentially includes a p-type semiconductor layer 51, an active layer 53, and an n-type semiconductor layer 55, and a top electrode 70 on the III-V compound semiconductor laminate 50. The top electrode 70 has an opening 71 for ejecting light emitted by the active layer 53. The current narrowing layer 30 has a dielectric layer 31 provided with a through hole 32, and an intermediate electrode 35 provided in the through hole 32 and electrically connecting between the p-type semiconductor layer 51 and the metal layer 20. Furthermore, in a projection plane in which the current narrowing layer 30 including the intermediate electrode 35 is projected vertically to the top electrode 70, the opening 71 encloses the intermediate electrode 35 and the dielectric layer 31 encloses the top electrode 70. The thickness of the p-type semiconductor layer 51 is 0.5 μm or more and 3.3 μm or less. In this specification, the term "encapsulated" does not include a case in which regions completely coincide in the projection plane. In addition, in FIG. 1, a mesa structure is formed in the semiconductor laminate 50, and a part of a peripheral edge of the dielectric layer 31 is exposed in the film thickness direction. The details of each configuration will be described in turn below.

<Support Substrate>

Since the point source type light-emitting diode 100 according to the present disclosure is formed by a "bonding method" (refer to JP 2018-006495 A) described below, the support substrate 10 has no particular limitation in relation to a lattice constant of semiconductor layers to be formed thereon. Suitable materials for the support substrate 10 include, for example, semiconductor substrates such as Si substrates, metal substrates made of Mo, W, Kovar, or the like, various submount substrates made of MN or the like, and the like. It is preferable that the support substrate 10 is conductive.

<Metal Layer>

The metal layer 20 is not particularly limited as long as the metal layer 20 is made of metal that can form the light-reflecting surface 21 for reflecting light and can be electrically connected to the p-type semiconductor layer 51 via the intermediate electrode 35. Specifically, Au is preferably contained as a main component, and more specifically, Au preferably accounts for more than 50 mass %, and Au even more preferably accounts for more than 80 mass %. As illustrated in FIG. 1, the metal layer 20 can be formed by bonding a metal bonding layer 25 on the side of the support substrate and a metal reflective layer 27. In a case in which the metal layer 20 includes a metal layer made of Au (hereinafter referred to as "Au metal layer"), the thickness of the Au metal layer is preferably more than 50% of the total thickness of the metal layer 20. Al, Pt, Ti, Ag, or the like can be used in addition to Au, as the metal (i.e., reflective metal) making up the metal layer 20. These reflective metal elements are origin of the reflective metal contained in the metal layer 20 of the point source type light-emitting diode 100 according to the present disclosure. For example, the metal layer 20 may be a single layer made of only Au, or two or more Au metal layers may be included as the metal layer 20. In particular, the light reflecting surface 21 is preferably a surface of the Au metal layer. The thickness of one Au metal layer in the metal layer 20 may be, for example, 400 nm to 2000 nm, and the thickness of a metal layer made of metal other than Au may be, for example, 5 nm to 200 nm.

<Current Narrowing Layer>

The current narrowing layer 30 includes the dielectric layer 31 and the intermediate electrode 35 that electrically connects between the p-type semiconductor layer 51 and the metal layer 20. The dielectric layer 31 has the through hole 32, and the intermediate electrode 35 is provided in the through hole 32. In the current narrowing layer 30, a substantial electric conduction region is the intermediate electrode 35 formed in the through hole 32. Since the intermediate electrode 35 is filled in the through hole 32, the shape of the intermediate electrode 35 coincides with the shape of the through hole.

The size of the through hole 32 formed in the current narrowing layer 30 is not particularly limited as long as each configuration is formed so that the opening 71 encloses the intermediate electrode 35 and the dielectric layer 31 encloses the top electrode 70 in the projection plane in which the current narrowing layer 30 is projected vertically to the top electrode 70. In accordance with the relationship with the opening 71 of the top surface electrode 70, which will be described in detail later, the size of the through hole 32 is smaller than the opening 71 because the through hole 32 is enclosed in the opening 71 in the projection plane. In other words, the maximum length of the shape of the through hole (referred to as the width of the through hole in this specification) in cross section in the direction of a main plane of the current narrowing layer is smaller than the maximum opening diameter of the opening 71 (referred to as the width of the opening). The width of the through hole is exemplified by 5 to 150 μm, though the width depends on a chip size of the point source type light-emitting diode 100 and no limitation is intended.

The shape of the through hole 32 is not particularly limited, and may be cylindrical, elliptic cylindrical, (positive) triangular prism, (square) quadrangular prism, (positive) polygonal prism, irregular, or the like. The number of through holes 32 (i.e., the number of intermediate electrodes) per LED chip is arbitrary and may be one or more. Even in a case in which multiple through holes 32 are provided, all of the through holes 32 are enclosed in the opening 71 in the projection plane.

<<Material for Dielectric Layer>>

A material for the dielectric layer is not particularly limited, and any known material can be used. For example, $SiO_2$, SiN, AlN, or the like can be used as the dielectric material, and $SiO_2$ is particularly preferable. This is because $SiO_2$ is easy to etch with BHF or the like. As a material for the dielectric layer 31, a material transparent to light emitted from the active layer 53 is preferably used.

<<Material for Intermediate Electrode>>

A material for the intermediate electrode is not particularly limited, and any known material can be used. For example, the material for the intermediate electrode is preferably a material with a lower resistivity than the dielectric layer, and more specifically there is an AuZn-based material, an AuBe-based material, or the like, which is formed, for example, by rapid heating at a predetermined temperature after deposition using a boat heating method. The shape of the intermediate electrode is not particularly limited, and is formed in accordance with the shape of the through hole as described earlier.

<Semiconductor Laminate>

A semiconductor laminate 50 is provided on the current narrowing layer 30. The semiconductor laminate 50 is sequentially provided with the p-type semiconductor layer 51, the active layer 53, and the n-type semiconductor layer 55, and emits light by coupling between electrons and holes in the active layer 53 upon applying an electric current to the active layer 53. There is no particular limitation on composition of each layer of the semiconductor laminate 50.

<<P-Type Semiconductor Layer>>

The p-type semiconductor layer 51 is provided on the current narrowing layer 30. The p-type semiconductor layer 51 may have a p-type contact layer and a p-type cladding layer in this order from the side of the support substrate 10. An intermediate layer may be provided between the p-type cladding layer and the p-type contact layer to lessen a lattice mismatch. The p-type cladding layer may have a multi-layer structure. A p-type spacer layer is preferably provided as a top layer of the p-type semiconductor layer 51. The composition of the p-type spacer layer may be constant in a crystal growth direction, may be graded in the crystal growth direction, or may be modulated (including non-continuous changes).

<<Active Layer>>

The active layer 53 is provided on the p-type semiconductor layer 51. The active layer 53 may have a single layer structure as illustrated in FIG. 1, or may preferably have a multiple quantum well (MQW) structure. The semiconductor laminate 50 even more preferably has the MQW structure in order to improve optical output by suppressing crystal defects. The MQW structure can be formed by a structure in which well layers and barrier layers are alternately provided. Both ends (i.e., the first and the last) of the active layer 53 in the thickness direction are preferably barrier layers, and if the number of repetitions of the well and barrier layers is n, this case is described as a multiple quantum well structure with "n.5 pairs".

<<N-Type Semiconductor Layer>>

The n-type semiconductor layer 55 is provided on the active layer 53. The n-type semiconductor layer 55 can be used as an n-type cladding layer. The n-type semiconductor layer 55 may have a single layer structure or a composite layer in which multiple layers are laminated. It is also preferable to provide an n-type spacer layer as a bottom layer of the n-type semiconductor layer 55 (a layer on the side of the activation layer 53). The composition of the n-type spacer layer may be constant in a crystal growth direction, may be compositionally graded in the crystal growth direction, or may be modulated. The n-type semiconductor layer 55 may have an n-type contact layer, if necessary.

—Thickness of P-Type Semiconductor Layer—

In the present disclosure, the thickness of the p-type semiconductor layer 51 is set at 0.5 µm or more and 3.3 µm or less. In a case in which the p-type semiconductor layer 51 has multiple p-type layers, the total thickness of the p-type layers is set at 0.5 µm or more and 3.3 µm or less. In a case in which the thickness of the p-type semiconductor layer 51 is in this range, the thickness of the p-type semiconductor layer 51 is sufficiently thin, current passed through the intermediate electrode 35 inside the through hole 32 flows into the active layer 53 with little diffusion in an in-plane direction of the p-type semiconductor layer 51. Therefore, the current concentrates at a specific part of the active layer 53, and light is emitted locally at the part.

In this specification, a region that locally emits light due to current concentrating at a specific part of the active layer 53 is referred to as a main light-emitting region 53A. Since the thickness of the p-type semiconductor layer 51 is sufficiently thin as described above, the size and position of the main light-emitting region 53A are considered to be equivalent to a projection of the intermediate electrode 35 vertically projected onto the active layer 53. Accordingly, in this specification, it is assumed that the main light-emitting region 53A described above is a projection plane in which the intermediate electrode 35 is vertically projected to the active layer 53. By limiting the thickness of the p-type semiconductor layer 51 within the above range, it is possible to suppress the spread of the current, to reduce the effects of surface recoupling at portions in which the active layer is exposed from chip side surfaces, and to reduce variations in emission output in response to variations in temperature. The reason for this is thought to be that if the thickness of the p-type semiconductor layer 51 is within the above range, the rate at which surface recombination occurs does not change even if mobility changes due to variations in temperature.

As described above, the total thickness of the p-type semiconductor layer 51 is 0.5 µm or more and 3.3 µm or less, and the total thickness of the p-type semiconductor layer 51 is preferably 0.5 µm or more and 3.0 µm or less, more preferably 0.9 µm or more, and more preferably 2.8 µm or less.

The reason why the thickness of the p-type semiconductor layer 51 is set at 0.5 µm or more is because if the thickness is less than 0.5 µm, a light-emitting device has decreased reliability and may suddenly die in response to variations in temperature.

There is no limitation on the thickness of each p-type layer in the p-type semiconductor layer, as long as the above total thickness is satisfied. The thickness of the p-type cladding layer is exemplified by 0.1 µm to 2.5 µm, the thickness of the p-type contact layer is exemplified by 10 nm to 100 nm, and the thickness of the p-type spacer layer is exemplified by 300 to 700 nm. of the p-type spacer layer can be 300 to 700 nm.

—Composition of Each Semiconductor Layer—

The composition of each of the p-type semiconductor layer 51, the active layer 53, and the n-type semiconductor layer 55 may be appropriately determined based on the composition of III-V compound semiconductor of the active layer 53, which is a dominant factor of an emission wavelength of the point source type light-emitting diode 100.

—Composition of Active Layer—

The active layer is made of III-V compound semiconductor, and the composition of the III-V compound semiconductor of the active layer 53 is described below as $(In_{a1}Ga_{b1}Al_{c1})(P_{x1}As_{y1}Sb_{z1})$; $c_1=1-a_1-b_1$, $z_1=1-x_1-y_1$, $0 \le a_1 \le 1$, $0 \le b_1 \le 1$, $0 \le c_1 \le 1$, $0 \le x_1 \le 1$, $0 \le y_1 \le 1$, $0 \le z_1 \le 1$.

The active layer 53 may be a single layer or have a laminated structure such as multiple quantum well made of for example, made of an AlGaAs-based material, an AlGaAsInP-based material, an AlGaAsP-based material, an AlInGaP-based material, an InGaAsSb-based material, or the like. Any of these can be formed by epitaxial growth using a known method such as a MOCVD method. The emission wavelength may be in a range of 580 to 4000 nm, for example, and the emission wavelength is preferably in a range of 630 to 1100 nm. The thickness of the active layer is not particularly limited, unlike the thickness of the p-type semiconductor layer 51, and the active layer is preferably 10 to 500 nm.

For example, in a case in which an emission center wavelength is set at 630 to 1100 nm, the composition ratio $a_1$ of In in the active layer (or each layer in the case of including a well layer and a barrier layer) may be set at 0.0 to 1.0, the composition ratio $b_1$ of Ga may be set at 0.0 to 1.0, the composition ratio $c_1$ of Al may be set at 0.0 to 0.5, the composition ratio $x_1$ of P may be set at 0.0 to 1.0, the composition ratio $y_1$ of As may be set at 0.0 to 1.0, and the composition ratio $z_1$ of Sb may be set at 0.0 to 0.5.

—Composition of P-Type Semiconductor Layer—

For the composition of the p-type semiconductor layer 51, the composition of III-V compound semiconductor of the p-type semiconductor layer 51 may be appropriately determined based on the composition of the III-V compound semiconductor of the active layer 53. The p-type contact layer may be exemplified by a p-type AlGaAs or p-type InGaAs layer, or the like, the p-type cladding layer may be exemplified by a p-type AlGaAs or p-type InP layer, or the like, and the p-type spacer layer may be exemplified by a p-type AlGaAs layer or the like.

—Composition of N-Type Semiconductor Layer—

For the composition of the n-type semiconductor layer 55, the composition of III-V compound semiconductor of the n-type semiconductor layer 55 may be appropriately determined based on the composition of the III-V compound semiconductor of the active layer 53. The n-type spacer layer may be exemplified by n-type AlGaAs, n-type InP, or the like, and the n-type cladding layer may be exemplified by n-type AlGaAs.

—Thicknesses—

Unlike the total thickness of the p-type semiconductor layer 51, the thicknesses of the active layer 53 and the n-type semiconductor layer 55 are not limited.

—Thickness of Active Layer—

In a case in which the active layer 53 has a quantum well structure, the thickness of a well layer may be 3 nm to 17 nm, the thickness of a barrier layer may be 5 nm to 20 nm, and the number of pairs of the well layer and the barrier layer may be 3 to 50. In any of the cases of a single layer structure and a quantum well structure, the thickness of the entire active layer may be 100 nm to 500 nm.

—Thickness of N-Type Semiconductor Layer—

The thickness of the n-type cladding layer is not limited and may be exemplified by 1 μm to 15 μm, or 3.5 μm to 12 μm, for example. The thickness of the n-type spacer layer is not limited and may be, for example, 5 to 500 nm. It is preferable that the thickness of the entire n-type semiconductor layer 55 is made larger than the thickness of the entire p-type semiconductor layer 51. This is because p-type semiconductor generally has low electron mobility and high resistance and is therefore easy to use as a current narrowing structure, while in the present disclosure it is desirable to spread current on the side of an n-type semiconductor layer.

—Thickness of Entire Semiconductor Laminate—

The thickness of the entire semiconductor laminate 50 is not limited and may be, for example, 2 μm to 17 μm.

In each layer constituting the semiconductor laminate 50 may be doped with a known n-type dopant (Te, Si, or the like) or p-type dopant (Zn, C, Mg, or the like) as appropriate.

Each layer constituting the semiconductor laminate 50 can have a uniform structure in terms of composition and the like in a plane of each layer, and thus does not require a complicated manufacturing process.

<Top Electrode>

The top electrode 70 is provided on the semiconductor laminate 50. The top electrode 70 has the opening 71, and light emitted by the active layer 53 is ejected from the opening 71. In the projection plane in which the current narrowing layer 30 including the intermediate electrode 35 is projected vertically onto the top electrode 70, the opening 71 encloses the intermediate electrode 35 and the dielectric layer 31 encloses the top electrode 70.

In other words, the opening 71 of the top electrode 70 is equal to or greater than the intermediate electrode 35 in size, and the intermediate electrode 35 is contained in the opening 71 in a plan view viewed from the film thickness direction. Therefore, in a projection plane of the point source type light-emitting diode 100, in which the intermediate electrode 35 is projected vertically onto the top electrode 70, the projection of the intermediate electrode 35 is present in the opening 71. Also, in the plan view viewed from the film thickness direction, the top electrode 70 is contained in between an outer edge and an inner edge of the dielectric layer 31. Therefore, in the point source type light-emitting diode 100, the top electrode is present in an inner region of the projection of the dielectric layer 31 in the projection plane in which the dielectric layer 31 is projected vertically to the top electrode 70.

The shape of the opening 71 of the top electrode 70 is not particularly limited as long as the opening 71 encloses the middle electrode 35 in the projection plane in which the intermediate electrode 35 is projected vertically onto the top electrode 70. The shape of the opening 71 may be a circle, an ellipse, a star-shape, or a polygon.

It is preferable that both the opening 71 and the intermediate electrode 35 are disposed in such positions that the centers of gravity (geometric centers) of the opening 71 and the intermediate electrode 35 coincide in the projection plane in which the intermediate electrode 35 is projected vertically onto the top electrode 70. The size of the main light-emitting region 53A and the position of the main light-emitting region 53A in the plane are substantially the same as the projection of the intermediate electrode 35 onto the main surface of the active layer 53. Therefore, in the case of FIG. 1, the central axis of the opening 71 overlaps with the center of the main light-emitting region 53A. This is preferable because light emitted by the main light-emitting region 53A can be efficiently taken out to the outside.

<Other Electrodes>

A top-side pad electrode E1 and a bottom electrode E2 are provided on the top electrode 70 and on a bottom surface of the support substrate 10, respectively, and a common metal material including a metal such as Ti, Pt, or Au, another metal (e.g., Sn) that forms an eutectic alloy with gold, or the like can be used to construct each electrode. The electrode patterns of the top side pad electrode E1 and the back side electrode E2 are optional and not restricted in any way.

As described above, in the point source type light-emitting diode 100 according to the present disclosure, main current flowing between the top electrode 70 and the bottom electrode E2 formed on the bottom surface of the support substrate 10 passes through the main light-emitting region 53A of the active layer 53 via the intermediate electrode 35 provided in the through hole 32. At this time, the current is narrowed due to high resistance of the p-type semiconductor layer 51, and the current can be concentrated at a specific part of the active layer 53. As a result, light can be emitted locally at the specific part of the active layer 53. In this way, according to the present disclosure, a point source type light-emitting diode can be obtained by using a simple structure based on the arrangement relationship of the current narrowing layer 30 and the top electrode 70 and the thickness of the p-type semiconductor layer 51. Therefore, according to the present disclosure, it is possible to manufacture a point source type light-emitting diode with a simplified manufacturing process.

By the way, in the case of using point source type light-emitting diodes as light sources for sensors and the like, it is necessary to suppress variations in emission output under various harsh temperature environments such as high temperature environments or cold areas. As will be described in detail together with technical significance of a shortest separation distance below, the present disclosure is also more advantageous in this respect because the point source type light-emitting diode has a superior temperature-dependent characteristic by limiting the thickness of the p-type semiconductor layer 51.

<Separation Distance>

The shortest separation distance between an outermost periphery of the main light-emitting region 53A and a peripheral edge of the active layer 53 is preferably 30 μm or more, and more preferably 60 μm or more. A point source type light-emitting diode that exhibits more superior temperature-dependent characteristic of emission output can be thereby provided. As described above, the size and position of the main light-emitting region 53A are considered to be equivalent to the projection in which the intermediate electrode 35 is projected vertically to the active layer 53. Therefore, the outermost periphery of the main light-emitting region 53A is defined by an outermost circumference of the projection. The following explains why the shortest separation distance is preferably 30 μm or more.

As one of methods to improve the temperature-dependent characteristic of emission output, reducing the effects of surface recoupling is important. In light-emitting diodes, such surface recoupling occurs significantly at a point in which an active layer is exposed to the side of a chip, and this is thought to be a cause of deterioration of the temperature-dependent characteristic. The surface recoupling occurs in a range of several times the diffusion length of free electrons from the point in which the active layer is exposed to the side of the chip. In the present disclosure, the thickness of the p-type semiconductor layer 51 is set in a predetermined range. Therefore, current can flow in the active layer 53 without substantially spreading in an in-plane direction of the p-type semiconductor layer 51, or current flowing in the in-plane direction of the p-type semiconductor layer 51 can be reduced. As a result, current flowing in the in-plane direction of the p-type semiconductor layer 51 is small. Based on this idea, if the shortest separation distance is secured and current is allowed to pass through the n-type semiconductor layer 55 before the current reaches the outer edge of the active layer 53, surface recoupling can be further suppressed, which is considered to be effective in further improving the temperature-dependent characteristic of emission output.

Although an upper limit of the shortest separation distance between the peripheral edge of the active layer and the outermost periphery of the main light-emitting region depends on a chip size of the point source type light-emitting diode 100, it is not particularly limited because the problem of surface recoupling described above does not occur if a sufficient shortest separation distance is provided. As an example, taking the chip size into consideration, 1000 μm can be exemplified as the upper limit of the shortest separation distance.

<Coating on Side of Active Layer>

Figure 2:
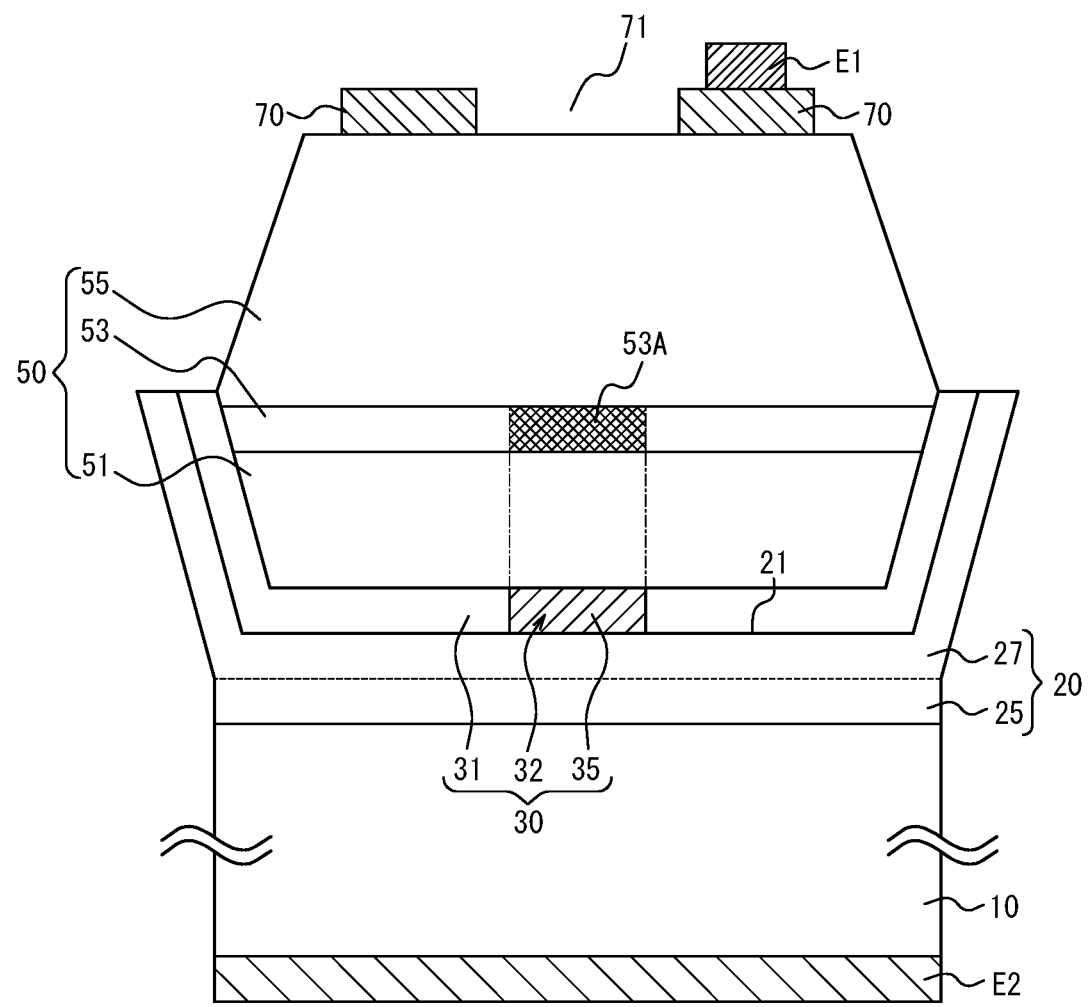
FIG. 2 is a schematic cross-sectional view of another aspect of the point source type light-emitting diode according to the present disclosure.

FIG. 2, which illustrates another aspect of the present disclosure is referred. In a point source type light-emitting diode 200, it is preferable that a light reflecting surface 21 of a metal layer 20 covers at least part of side surfaces of an active layer 53 via a dielectric layer 31. Since light emitted from the side surfaces of the active layer 53 can be confined in the side surfaces of the active layer 53, while part of the light can be reflected inside the semiconductor laminate 50 by the light reflecting surface 21 and be taken out to the outside, improvement in external quantum efficiency can be expected.

To form such a light-reflecting surface 21 that covers at least part of the side surfaces of the active layer, for example, the following procedure can be followed. First, an n-type semiconductor layer 55, the active layer 53, and a p-type semiconductor layer 51 are sequentially formed on a growth substrate according to a bonding method. Then, a mesa structure is formed from the side of the p-type semiconductor layer 51. Then, the dielectric layer 31 and a metal reflective layer 27 are formed sequentially to cover mesa structure inclined surfaces of the p-type semiconductor layer 51 and the active layer 53. After that, the metal reflective layer 27 is bonded to a support substrate 10 via a metal bonding layer 25, and the growth substrate is removed. Finally, a mesa structure is formed on the n-type semiconductor layer 55. In this way, the point source type light-emitting diode 200 having the light reflecting surface 21 according to an aspect of FIG. 2 can be formed.

Next, an aspect of a method for manufacturing the point source type light-emitting diode 100 (refer to FIG. 1) according to the present disclosure will be described.

(Manufacturing Method of Point Source Type Light-Emitting Diode)

A manufacturing method of the above-described point source type light-emitting diode according to the present disclosure includes at least: a first step of forming a semiconductor laminate 50 in which an n-type semiconductor layer 55, an active layer 53, and a p-type semiconductor layer 51 are sequentially provided on a growth substrate; a second step of forming a current narrowing layer 30 on the p-type semiconductor layer 51; a third step of forming a metal reflective layer 27 on the current narrowing layer 30; a fourth step of forming a metal layer 20, while a support substrate 10 having a metal bonding layer 25 on its surface is bonded to the metal reflective layer 27 via the metal bonding layer 25; a fifth step of removing the growth substrate; and a sixth step of forming a top electrode 70 having an opening 71 for ejecting light emitted by the active layer 53 on a growth substrate removed surface of the n-type semiconductor layer 55. In the third step, the current narrowing layer 30 that includes a dielectric layer 31 having a through hole 32 and an intermediate electrode 35 provided in the through hole 32 to electrically connect between the p-type semiconductor layer 51 and the metal layer 20 is formed. Furthermore, in a projection plane in which the current narrowing layer 30 including the intermediate electrode 35 is projected vertically onto the top electrode 70, the opening 71 encloses the intermediate electrode 35 and the dielectric layer 31 encloses the top electrode 70. The thickness of the p-type semiconductor layer 51 is 0.5 μm or more and 3.3 μm or less.

A III-V compound semiconductor material, a dielectric material, and a metal material that make up the respective layers, the thicknesses of the respective layers, number of pairs of stacked layers, and the like are as previously described, and duplicate explanations are omitted.

<First Step>

In the first step, a semiconductor laminate 50 in which an n-type semiconductor layer 55, an active layer 53, and a p-type semiconductor layer 51 are sequentially formed is formed on a growth substrate. An etch stop layer made of III-V compound semiconductor may be formed between the growth substrate and the n-type semiconductor layer 55, if necessary. The etch stop layer may also serve as a strain buffer layer. The growth substrate may be appropriately selected from a GaAs substrate, an InP substrate, a GaSb substrate, an InSb substrate, and the like, depending on the composition and lattice constant of the semiconductor laminate 50 to be grown on the growth substrate. Although an n-type substrate is preferably used because the n-type semiconductor layer is to be formed on the growth substrate, the conductivity type of the growth substrate may be undoped or p-type.

Each layer of the semiconductor laminate can be formed by a known thin-film growth method, such as metal organic chemical vapor deposition (MOCVD), molecular beam epitaxy (MBE), or sputtering. In the case of InGaAsP-based semiconductor, for example, trimethylindium (TMIn) is used as an In source, trimethylgallium (TMGa) is used as a Ga source, arsine (AsH$_3$) is used as an As source, and phosphine (PH$_3$) is used as a P source in a predetermined mixture ratio, and an InGaAsP-based semiconductor layer can be epitaxially grown at a desired thickness depending on a growth time by vapor-phase growth of gases of these materials, while using a carrier gas. In a case in which Al is used as a group III element, for example, trimethylaluminum (TMA) or the like may be used as an Al source, and in a case in which Sb is used as a group V element, TMSb (trimethylantimony) or the like may be used as an Sb source. Furthermore, in the case of doping each semiconductor layer into p-type or n-type, a dopant source gas containing Si, Zn, or the like as a constituent element can be further used if desired.

<Second to Fourth Steps>

An intermediate electrode layer, a dielectric layer, a metal reflective layer, a metal bonding layer, a top electrode, and the like can be formed using a known method, such as sputtering, electron beam deposition, resistance heating or the like. In the case of forming the dielectric layer, a known deposition method, such as plasma CVD or sputtering, can be applied, and if necessary, a known etching method may be used to form projections and depressions.

<<Second Step>>

In the second step, a current narrowing layer 30 with an intermediate electrode 35 is formed on the p-type semiconductor layer 51. For example, the intermediate electrode 35 is formed on a part of a surface of the p-type semiconductor layer 51 by a sputtering method or the like, and a surface of the remaining part is exposed. Then, a dielectric layer 31 is formed on the exposed part and aligned with the height of the intermediate electrode 35 to form the current narrowing layer 30. A portion assuming that the intermediate electrode 35 is removed from the current narrowing layer 30 corresponds to a through hole 32, which has already been described. After forming a dielectric layer, a part of the dielectric layer may be removed by etching or the like to expose the p-type semiconductor layer 51 and form a through hole 32, and an intermediate electrode 35 may be formed in the through hole 32.

<<Third Step>>

In the subsequent third step, a metal reflective layer 27 is formed on the current narrowing layer 30. As a result, a light reflecting surface 21 is provided on the side of the p-type semiconductor layer 51 in the semiconductor laminate 50.

<<Fourth Step>>

Next, in the fourth step, after a metal bonding layer 25 is provided on one side of a support substrate 10, the support substrate 10 is bonded to the metal reflective layer 27 via the metal bonding layer 25 to obtain a metal layer 20. The metal reflective layer 27 and the metal bonding layer 25 may be placed facing each other and bonded by heat compression or the like.

<Fifth Step>

In the fifth step, the growth substrate is removed by a known method. For example, the growth substrate can be removed by wet etching using a mixture of an ammonia solution and a hydrogen peroxide solution, and the above-described etch stop layer may be used as an endpoint of the wet etching. The etching stop layer may be removed by wet etching with a different etchant (e.g. an etchant of a diluted hydrochloric acid) from that of the growth substrate.

<Sixth Step>

Finally, in the sixth step, a top electrode 70 is formed on a growth substrate removed surface of the n-type semiconductor layer 55. As a method for forming the top electrode, a known method can be used, such as a sputtering method, an electron beam evaporation method, or a resistance heating method. The top electrode 70 is provided with an opening 71, which has already been described, and the arrangement relationship of the top electrode 70, the opening 71, the dielectric layer 31, and the intermediate electrode 35 in the projection plane is as previously described.

<Other Steps>

After the sixth step, roughening processing may be performed to form a plurality of bumps on a light take-out surface. Furthermore, a mesa structure may be formed on planned cutting lines for dicing point source type light-emitting diodes. After that, a bottom electrode E2 is formed to manufacture a point source type light-emitting diode of the present disclosure.

EXAMPLES

The present disclosure will be hereinafter described in more detail by the following examples, but the present disclosure is not limited to the following examples.

Experimental Example 1

The following point source type light-emitting diodes were manufactured by a bonding method with a target emission center wavelength of 850 nm.

Example 1

An n-type GaAs substrate was used as a growth substrate. An etching stop layer was formed on a (100) surface of the growth substrate by the MOCVD method, and then each semiconductor layer was epitaxially grown by the MOCVD method under the following conditions.

<1> N-type Al$_{0.20}$Ga$_{0.80}$As layer with a thickness of 7100 nm (doped with Te, 8.0×10$^{17}$ atoms/cm$^3$; first n-type cladding layer)

<2> N-type Al$_{0.40}$Ga$_{0.60}$As layer with a thickness of 400 nm (doped with Te, 1.0×10$^{17}$ atoms/cm$^3$; second n-type cladding layer)

<3> Al$_{0.24}$Ga$_{0.76}$As layer with a thickness of 500 nm (undoped; n-side spacer layer)

<4> Quantum well type active layer with an entire thickness of 310 nm (refer to below for details)

<5> P-type Al$_{0.24}$Ga$_{0.76}$As layer with a thickness of 500 nm (doped with C, 2.0×10$^{16}$ atoms/cm$^3$; p-side spacer layer)

<6> Al$_{0.40}$Ga$_{0.60}$As layer with a thickness of 400 nm (doped with C, 1.5×10$^{18}$ atoms/cm$^3$; second p-type cladding layer)

<7> Al$_{0.20}$Ga$_{0.80}$As layer with a thickness of 1500 nm (doped with C, 1.5×10$^{18}$ atoms/cm$^3$; first p-type cladding layer)

<8> P-type Al$_{0.12}$Ga$_{0.88}$As layer with a thickness of 100 nm (doped with Zn, 3×10$^{18}$ atoms/cm$^3$; p-type contact layer)

In Example 1, the total thickness of the p-type semiconductor layer (the sum of the p-type contact layer, the p-type cladding layers, and the p-side spacer layer) is 2.5 μm. In forming an active layer, an Al$_{0.2}$Ga$_{0.8}$As$_{0.6}$P$_{0.4}$ barrier layer with a thickness of 17.5 nm was first formed, and then 13 pairs of an Al$_{0.069}$In$_{0.16}$Ga$_{0.771}$As well layer with a thickness of 5 nm and an Al$_{0.2}$Ga$_{0.8}$As$_{0.6}$P$_{0.4}$ barrier layer with a thickness of 17.5 nm were formed, and thereby 13.5 pairs were formed in total.

The composition and dopant concentration of each layer in Example 1 are values measured by SIMS analysis.

Next, a dielectric layer made of SiO$_2$ (thickness: 550 nm) was formed on the entire surface of the p-type contact layer by the plasma CVD method. Then, after a resist pattern was formed on areas except for areas in which through holes were to be formed, the dielectric layer was etched away with BHF from the through hole formation areas to expose the p-type contact layer, and thereby through holes were formed in the dielectric layer.

Next, cylindrical intermediate electrodes (metal material of the electrode: AuZn, thickness: 540 nm) with a diameter of L$_2$ were formed in the through holes in the dielectric layer on the p-type contact layer. For the formation of a cylindrical pattern, a resist pattern was formed, and then the intermediate electrodes were deposited, and the resist pattern was lifted off.

Next, metal reflective layers (Al/Au/Pt/Au) were sequentially formed on the entire surface of the current narrowing layer by vapor deposition. The total thickness of the metal reflective layers is 1660 nm.

On the other hand, metal bonding layers (Ti/Pt/Au) were formed on a conductive Si substrate (film thickness: 200 µm), which serves as a support substrate. The total thickness of the metal bonding layers is 1570 nm.

The metal reflective layers and the metal bonding layers were placed opposite each other and heat compression bonding was performed at 300° C. Then, the growth substrate was wet etched and removed with a mixture of an ammonia water and a hydrogen peroxide water and an etching stop layer was exposed, and further the etching stop layer was wet etched and removed with a hydrochloric acid diluent and the second n-type cladding layer was exposed.

On the second n-type cladding layer, n-type electrodes (Au (thickness: 10 nm)/Ge (thickness: 33 nm)/Au (thickness: 57 nm)/Ni (thickness: 34 nm)/Au (thickness: 800 nm)/Ti (thickness: 100 nm)/Au (thickness: 1000 nm)) were formed as top electrodes by formation of a resist pattern, deposition of the n-type electrodes, and lift-off of the resist pattern. Openings by the resist pattern each have an opening diameter of L$_1$, and the center of each opening and the center of each intermediate electrode were concentrically arranged. Furthermore, a pad (Ti (thickness: 150 nm)/Pt (thickness: 100 nm)/Au (thickness: 2500 nm)) was formed on a part of each n-type electrode.

Figure 3:
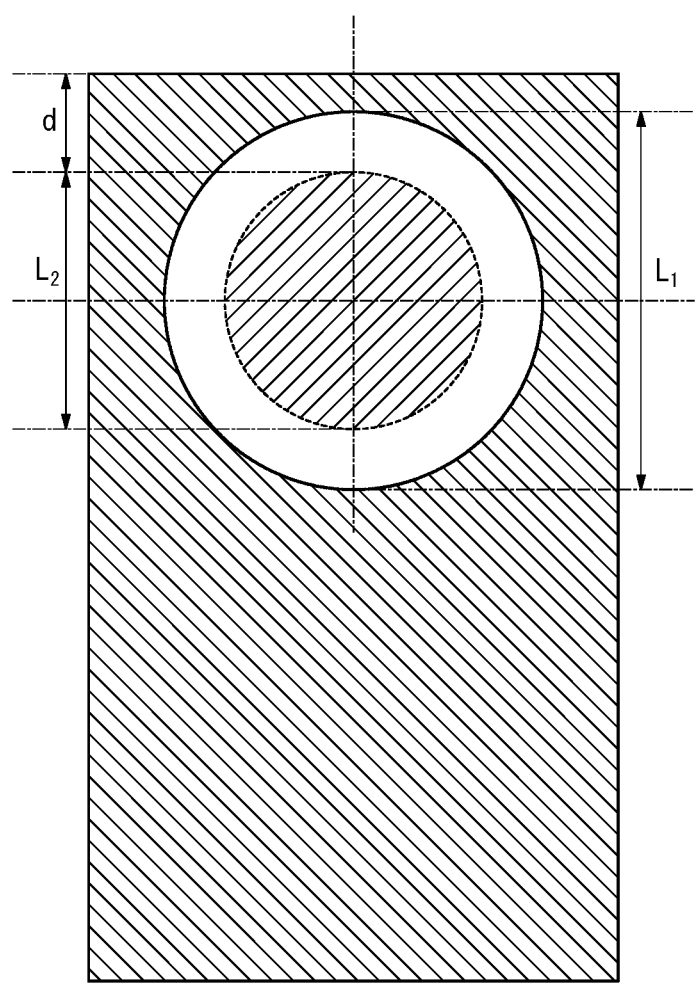
FIG. 3 is a top view for explaining the position and size relationship between an opening and an intermediate electrode in point source type light-emitting diodes according to examples 1 to 4.

Finally, the semiconductor layers between each element were removed by mesa etching (etching width: 40 µm) to form dicing lines. Then, bottom electrodes (Ti (thickness: 10 nm)/Pt (thickness: 50 nm)/Au (thickness: 200 nm)) were formed to a rear side of the Si substrate, and chips were diced by dicing, to manufacture point source type light-emitting diodes according to Example 1. Of double circles in FIG. 3, the outer circle represents the opening in the top electrode, and the inner circle (hatched area) represents the intermediate electrode 35. A chip size is 250 µm×400 µm. In Example 1, the size of the opening (opening diameter d2) is ϕ80 µm, the width d1 of the intermediate electrode is ϕ40 µm, and the maximum diameter of a main light-emitting region and the shortest separation distance between an outermost periphery of a projection of the intermediate electrode (main light-emitting region) and a peripheral edge of the active layer is 68 µm.

<Evaluation of Emission Intensity Distribution>

Figure 5A:
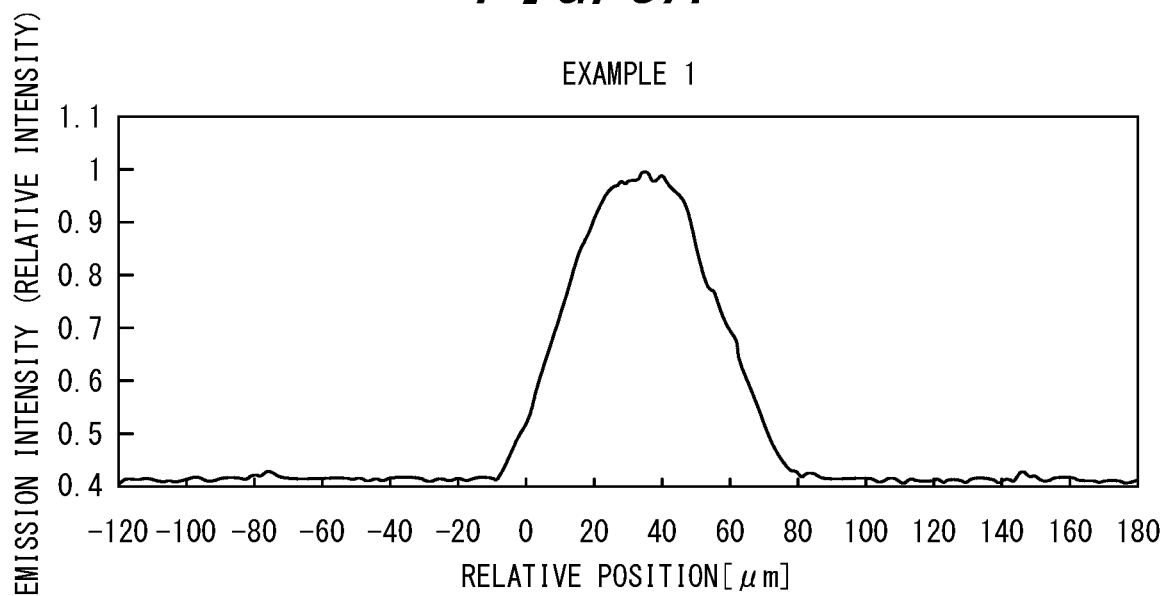
FIG. 5A is a graph illustrating emission intensity distribution of the example 1.

The point source type light-emitting diode according to Example 1 was operated in pulse drive (pulse forward current Ifp: 100 mA, frequency: 10 kHz, duty ratio: 0.2%). FIG. 5A illustrates the emission intensity distribution in a cross section including the opening. The emission intensity distribution was observed using an infrared microscope. In FIG. 5A, the vertical axis represents emission intensity (relative intensity), and the horizontal axis represents arbitrary relative position in the cross section. Images observed by the infrared microscope, in which stronger emission intensity was represented by white, while weaker emission intensity was represented by black, were graphed by quantifying the degree of white and black. Therefore, even where the degree of black is the strongest, the numerical value does not indicate zero. Referring to FIG. 5A, it was found out that most of emission was ejected from the opening and the point source type light-emitting diode had characteristics unique to point light sources. Since the emission intensity was large at ϕ40 µm, which was the width (d1) of the intermediate electrode, and decreased toward an edge of ϕ80 µm, which was the size (d2) of the opening, it was verified that in Example 1, in which the total thickness of the p-type semiconductor layer was 2.5 µm, current flowed with little diffusion to the outside of a range corresponding to the intermediate electrode in the in-plane direction of the p-type semiconductor layer 51, and concentrated into a specific part of the active layer 53, resulting in localized emission in that part. The point source type light-emitting diode according to Example 1 was manufactured using the junction method and verified to be obtained by a simplified manufacturing process compared to the conventional technology, as described below.

Conventional known methods for forming a current narrowing structure include the implantation method, Zn diffusion method, and ion implantation method. The implantation method requires two crystal growth processes by the MOCVD method. The implantation method also requires a patterning process, an etching process, and a growth substrate preparation process for regrowth between the two crystal growth processes. The Zn diffusion method also requires a patterning process and a Zn diffusion process, as well as equipment for Zn diffusion. The ion implantation method also requires a patterning process and an ion implantation process, and equipment for ion implantation. The ion implantation equipment is more expensive than other equipment. Compared to these conventional techniques, the patterning process in the bonding method according to Example 1 is simple and the bonding equipment is inexpensive. Thus, according to Example 1, it is found out that the point source type light-emitting diode can be easily manufactured with the simple manufacturing process with reduced manufacturing cost.

Experimental Example 2

Next, point source type light-emitting diodes according to the following Examples 2 to 4 and Comparative Example 1 were manufactured by the bonding method to evaluate the emission intensity distribution and temperature-dependent characteristic, while setting the target emission center wavelength at 850 nm as in Experimental Example 1.

Examples 2 to 4

Point source type light-emitting diodes were manufactured in the same manner as in Example 1, except that the chip size, the size of the opening, the width of the intermediate electrode, the maximum diameter of the main light-emitting region, and the minimum separation distance between the outermost periphery of the projection of the intermediate electrode (main light-emitting region) and the outer edge of the active layer were set to the values indicated in Table 1. The above sizes, including those of Example 1, are indicated in Table 1.

Comparative Example 1

Figure 4:
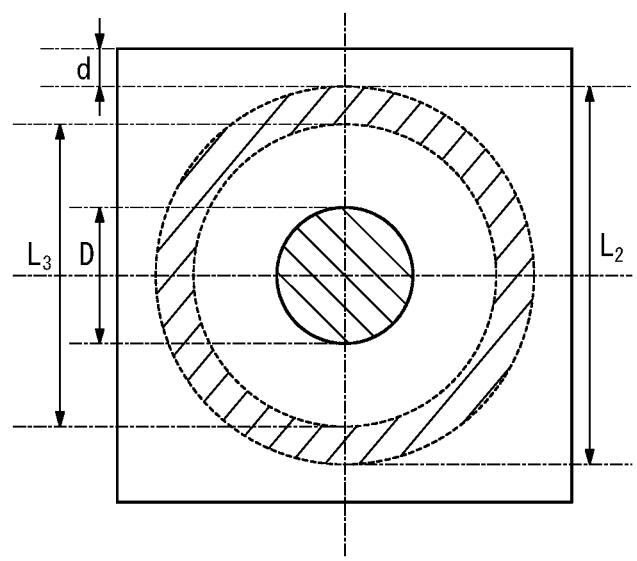
FIG. 4 is a top view for explaining the position and size relationship between an opening and an intermediate electrode in a point source type light-emitting diode according to a comparative example 1.

In Comparative Example 1, the shape of the intermediate electrode was the so-called doughnut shape (refer to FIG. 4), and a top electrode with a diameter D of φ120 μm was formed on the center of the donut-shaped intermediate electrode. Unlike Examples 1 to 4, no opening was provided. In FIG. 4, the portion surrounded by a circle with the smallest diameter of the three circles (diagonally right down hatched portion) represents the top electrode. The portion surrounded by the two outer circles of the three circles (diagonally left down hatched portion in FIG. 4) corresponds to the intermediate electrode. The intermediate electrode has an outer diameter $L_2$ of 300 μm, and an inner diameter $L_3$ of 270 μm. The minimum separation distance d is 25 μm. The other conditions were the same as those of Example 1. The above sizes are indicated in Table 2.

TABLE 1

|  | Example 1 | Example 2 | Example 3 | Example 4 |
|---|---|---|---|---|
| Chip size | 250 μm × 400 μm | | | |
| Width of opening ($L_1$) | φ 80 μm | φ 80 μm | φ 160 μm | φ 160 μm |
| Width of intermediate electrode ($L_2$) | φ 40 μm | φ 50 μm | φ 120 μm | φ 140 μm |
| Shortest separation distance (d) | 68 μm | 62 μm | 43 μm | 33 μm |
| Temperature-dependent characteristic of output (20 mA) | −0.13%/° C. | −0.13%/° C. | −0.16%/° C. | −0.17%/° C. |

TABLE 2

|  | Comparative Example 1 (Doughnut-shaped intermediate electrode) |
|---|---|
| Chip size | 350 μm × 350 μm |
| Diameter of electrode (D) | φ 120 μm |
| Width of opening ($L_1$) | None |
| Outer diameter of intermediate electrode ($L_2$) | 300 μm |
| Inner diameter of intermediate electrode ($L_3$) | 270 μm |
| Shortest separation distance (d) | 25 μm |
| Temperature-dependent characteristic of output (20 mA) | −0.30%/° C. |

<Evaluation of Emission Intensity Distribution>

Figure 5B:
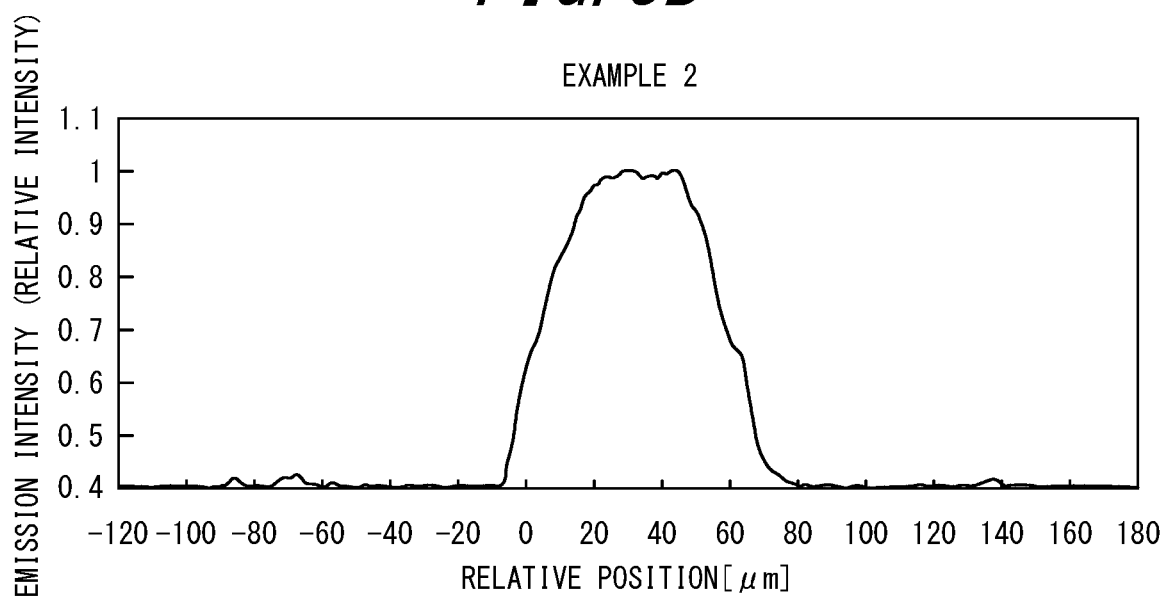
FIG. 5B is a graph illustrating emission intensity distribution of the example 2.
Figure 5C:
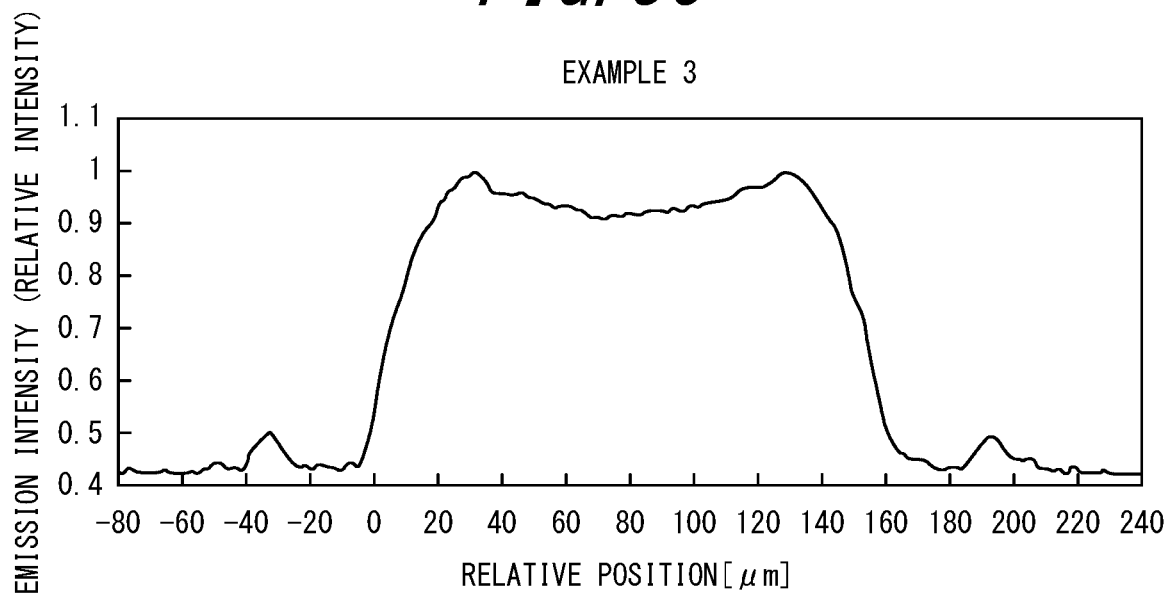
FIG. 5C is a graph illustrating emission intensity distribution of the example 3.
Figure 5D:
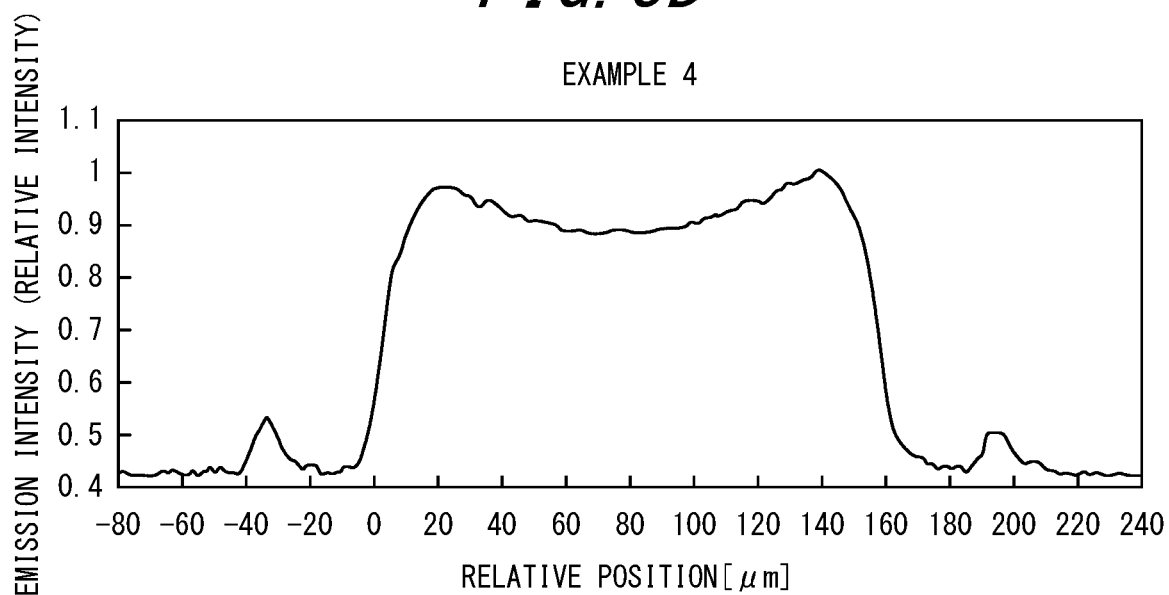
FIG. 5D is a graph illustrating emission intensity distribution of the example 4.

The emission intensity distribution according to Examples 2 to 4 was measured in the same way as in Experimental Example 1. FIGS. 5B to 5D illustrate results. Referring to FIGS. 5B to 5D, it was found out that most of emission was ejected from the opening and the point source type light-emitting diodes had characteristics unique to point light sources in Examples 2 to 4 as well as in Example 1. Since the emission intensity was large in a range of the width (d1) of the intermediate electrode, and decreased toward an edge of the size (d2) of the opening, it was verified that in a case in which the total thickness of the p-type semiconductor layer was 2.5 μm, current flowed with little diffusion to the outside of a range corresponding to the intermediate electrode in the in-plane direction of the p-type semiconductor layer 51, and concentrated into a specific part of the active layer 53, resulting in localized emission in that part.

<Temperature-Dependent Characteristic of Emission Output>

In a case in which the point source type light-emitting diodes of Examples 1 to 4 and Comparative Example 1 were operated at −25° C. to 100° C., the value of each output relative to an output at 25° C. was plotted, and the slope of linear approximation was obtained as a temperature-dependent characteristic. The smaller the absolute value of the slope, the better the temperature characteristic (i.e., the smaller the temperature dependence of output). Tables 1 and 2 indicate the temperature-dependent characteristic (%/° C.) at a current value of 20 mA. To measure the temperature-dependent characteristic of output, a TO-18 metal stem on which the chip was mounted was first placed in a thermostatic bath. While the temperature of the thermostatic bath was varied, variations in output at each temperature was measured by measuring the output through a window of the thermostatic bath.

It should be noted here that the narrower the width of the intermediate electrode (intermediate electrode diameter $L_2$), the better the temperature-dependent characteristic. Usually, if the width of the intermediate electrode is narrow, that is, the electrode area of the intermediate electrode is small, current density becomes high. In this case, emission efficiency in a light-emitting layer should be relatively lower. However, the experimental facts indicated the results contrary to this idea. Comparing Examples 3 and 4 against Examples 1 and 2, the slope of output variations with temperature is smaller and the temperature-dependent characteristic is even better in Examples 1 and 2, in which the electrode area is smaller and the current density is higher. This is thought to be the effect of the shortest separation distance d rather than the effect of the width of the intermediate electrode. This is thought to be because the shortest separation distance d has an effect on the temperature-dependent characteristic with a boundary value of 30 μm, and the effect of surface recoupling is more conspicuous at portions in which the active layer is exposed from chip side surfaces. The range in which surface recoupling conspicuously occurs is several times the diffusion length of free electrons from the portions where the active layer is exposed from the chip side surfaces, and in this case, the boundary value of the shortest separation distance d is considered to be 30 μm. The boundary value of the shortest separation distance d, which affects the temperature-dependent characteristic, is considered to be 30 μm, based on the results of Comparative Example 1.

Experimental Example 3

Next, point source type light-emitting diodes according to the following Example 5 and Comparative Examples 2 and 3 were manufactured by the bonding method to evaluate the effect of the thickness of the p-type semiconductor layer, while setting the target emission center wavelength at 850 nm as in Experimental Example 1.

Example 5

A point source type light-emitting diode according to Example 5 was manufactured in the same manner as in Example 1, except that the total thickness of the p-type semiconductor layer (total of the p-type contact layer, p-type cladding layers, and p-side spacer layer) was set at 3.3 μm, which was thicker than 2.5 μm of Example 1. In Example 5, the thickness of the first p-type cladding layer was changed to 2100 nm, and the thickness of the p-side spacer layer was changed to 700 nm.

Comparative Example 2

A point source type light-emitting diode according to Comparative Example 2 was manufactured in the same manner as in Example 1, except that the total thickness of the p-type semiconductor layer (total of the p-type contact layer, p-type cladding layers, and p-side spacer layer) was set at 5.3 μm, which was thicker than 2.5 μm of Example 1. In Comparative Example 2, the thickness of the first p-type cladding layer was changed to 4300 nm.

Comparative Example 3

A point source type light-emitting diode according to Comparative Example 3 was manufactured in the same manner as in Example 1, except that the total thickness of the p-type semiconductor layer (total of the p-type contact layer, p-type cladding layers, and p-side spacer layer) was set at 0.41 μm, which is thinner than 2.5 μm of Example 1. In Comparative Example 3, the first p-type cladding layer was eliminated, and the p-type contact layer was changed to 10 nm, the second p-type cladding layer was changed to 100 nm, and the p-side spacer layer was changed to 300 nm.

<Evaluation of Emission Intensity and Forward Voltage>

For Examples 1 and 5 and Comparative Examples 2 and 3, emission output (mW) and forward voltage at a current of 20 mA were measured using a constant current voltage power supply. Table 3 indicates the results.

<Temperature-Dependent Characteristic of Emission Output>

In the same way as in Experimental Example 2 described above, except that a current at the time of measurement was changed from 20 mA to 5 mA, the value of each output relative to an output at 25° C. was plotted in a case in which the point source type light-emitting diodes were operated at −25° C. to 100° C., and the slope of linear approximation was obtained as a temperature dependent characteristic. To compare variations in output at each temperature, the temperature-dependent characteristic of output was measured by placing a TO-18 metal stem on which the chip was mounted in a thermostatic bath, and measuring an output through a window of the thermostatic bath, while the temperature of the thermostatic bath was varied. In this experimental example 3, when evaluating the temperature-dependent characteristic, the current at the time of measurement was changed from 20 mA to 5 mA because the resistance in the active layer is relatively larger at 5 mA than at 20 mA. As a result, current spreads more easily, and the effect of surface recoupling at portions in which the active layer was exposed from chip side surfaces becomes more conspicuous, resulting in a larger slope of the temperature dependence, and the difference in temperature dependence becomes easier to understand than when measuring at 20 mA. Table 3 indicates the results, along with the values of power optical conversion efficiency (WPE: Wall Plug Efficiency).

TABLE 3

|  | Total thickness of p-type semiconductor layer (μm) | Emission output (mW) | Forward voltage (V) | WPE (%) | Temperature-dependent characteristic of output at 5 mA |
|---|---|---|---|---|---|
| Example 1 | 2.5 | 1.63 | 1.54 | 5.3 | −0.20% |
| Example 5 | 3.3 | 1.43 | 1.53 | 4.7 | −0.24% |
| Comparative Example 2 | 5.3 | 1.16 | 1.49 | 3.9 | −0.30% |
| Comparative Example 3 | 0.4 | 0.54 | 2.80 | 1.0 | −0.19% (Note) |

(Note): Because LED did not emit light at a final stage of measurement (around 100° C.), the values are based on measurements taken up to 80° C.

From the results in Table 3, it is found out that a point source type light-emitting diode with large emission efficiency is obtained by setting the thickness of the p-type semiconductor layer 51 at 0.5 μm or more and 3.3 μm or less. As can be seen from the comparison between Examples 1 and 5 and Comparative Example 2, in a case in which the total thickness of the p-type semiconductor layer is thicker than 3.3 μm, the temperature dependence is greatly aggravated. On the other hand, in a case in which the total thickness of the p-type semiconductor layer is thinner than 0.5 μm, as in Comparative Example 3, durability to temperature change is lost.

INDUSTRIAL APPLICABILITY

According to the present disclosure, it is possible to provide a point source type light-emitting diode and a manufacturing method thereof, which can simplify a manufacturing process and has superior temperature-dependent characteristic.

REFERENCE SIGNS LIST

1 antenna array for 5G communications
10 support substrate
20 metal layer
25 metal bonding layer
27 metal reflective layer
30 current narrowing layer
31 dielectric layer 32 through hole
35 intermediate electrode
50 semiconductor laminate
51 p-type semiconductor layer
53 active layer
55 n-type semiconductor layer
70 top electrode
71 opening
E1 pad electrode
E2 bottom electrode
100 point source type light-emitting diode

The invention claimed is:

1. A point source type light-emitting diode comprising:
a support substrate;
a metal layer on the support substrate,
the metal layer having a light reflecting surface;
a current narrowing layer on the metal layer;
a III-V compound semiconductor laminate on the current narrowing layer,
the III-V compound semiconductor laminate including a p-type semiconductor layer,
an active layer on the p-type semiconductor layer,
an n-type semiconductor layer on the active layer; and
a top electrode on the III-V compound semiconductor laminate, wherein
the top electrode has an opening for ejecting light emitted by the active layer,
the current narrowing layer includes a dielectric layer having a through hole and an intermediate electrode provided in the through hole, and the intermediate electrode electrically connects between the p-type semiconductor layer and the metal layer,
in a projection plane in which the current narrowing layer including the intermediate electrode is projected vertically onto the top electrode, the opening encloses the intermediate electrode, and the dielectric layer encloses the top electrode,
the light reflecting surface covers inclined surfaces of a mesa structure of the p-type semiconductor layer and the active layer via the dielectric layer, and
a thickness of the p-type semiconductor layer is 0.5 µm or more and 3.3 µm or less.

2. The point source type light-emitting diode according to claim 1, wherein the opening and the intermediate electrode are disposed in such positions that centers of gravity of the opening and the intermediate electrode coincide in the projection plane.

3. The point source type light-emitting diode according to claim 1, wherein a shortest separation distance between a peripheral edge of the active layer and an outermost periphery of a main light-emitting region in the active layer is 30 µm or more.

4. The point source type light-emitting diode according to claim 3, wherein the shortest separation distance is 60 µm or more.

5. A manufacturing method of the point source type light-emitting diode according claim 1, the method comprising:
a first step for forming a semiconductor laminate including an n-type semiconductor layer, an active layer, and a p-type semiconductor layer sequentially on a growth substrate;
a second step for forming a current narrowing layer on the p-type semiconductor layer;
a third step for forming a metal reflective layer on the current narrowing layer;
a fourth step for forming a metal layer having a light reflecting surface, while a support substrate having a metal bonding layer on a surface is bonded to the metal reflective layer via the metal bonding layer;
a fifth step for removing the growth substrate; and
a sixth step for forming a top electrode on a growth substrate removed surface of the n-type semiconductor layer, the top electrode having an opening for ejecting light emitted by the active layer, wherein
in the third step, the current narrowing layer including a dielectric layer having a through hole and an intermediate electrode provided in the through hole to electrically connect between the p-type semiconductor layer and the metal layer is formed,
in a projection plane in which the current narrowing layer including the intermediate electrode is projected vertically onto the top electrode, the opening encloses the intermediate electrode, and the dielectric layer encloses the top electrode,
the light reflecting surface covers inclined surfaces of a mesa structure of the p-type semiconductor layer and the active layer via the dielectric layer, and
a thickness of the p-type semiconductor layer is 0.5 µm or more and 3.3 µm or less.

6. The point source type light-emitting diode according to claim 1, wherein
the p-type semiconductor layer has a top surface in contact with the active layer and a bottom surface opposite to the top surface, and
the light reflecting surface covers the bottom surface of the p-type semiconductor layer via the current narrowing layer.

7. The point source type light-emitting diode according to claim 1, wherein
the n-type semiconductor layer has a bottom surface in contact with the active layer and a top surface opposite to the bottom surface, and
the light reflective surface is arranged apart from the top surface of the n-type semiconductor layer.

* * * * *